(12) United States Patent
Fu et al.

(10) Patent No.: US 10,475,741 B2
(45) Date of Patent: Nov. 12, 2019

(54) CHIP

(71) Applicant: Huawei Technologies Co., Ltd., Shenzhen (CN)

(72) Inventors: HuiLi Fu, Shenzhen (CN); Xiaodong Zhang, Shanghai (CN); Jyh Rong Lin, Zhubei (TW); Zhiqiang Ma, Zhubei (TW)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/715,654

(22) Filed: Sep. 26, 2017

(65) Prior Publication Data

US 2018/0025973 A1    Jan. 25, 2018

Related U.S. Application Data

(63) Continuation of application No. PCT/CN2015/076562, filed on Apr. 14, 2015.

(51) Int. Cl.
| | |
|---|---|
| *H01L 23/528* | (2006.01) |
| *H01L 21/56* | (2006.01) |
| *H01L 23/49* | (2006.01) |
| *H01L 23/532* | (2006.01) |

(52) U.S. Cl.
CPC ........... *H01L 23/528* (2013.01); *H01L 23/49* (2013.01); *H01L 23/5329* (2013.01)

(58) Field of Classification Search
CPC . H01L 23/528; H01L 23/48; H01L 23/49811; H01L 23/5384; H01L 23/5389; H01L 23/5329; H01L 23/367

USPC .......................................................... 257/499
See application file for complete search history.

(56) References Cited

U.S. PATENT DOCUMENTS

| | | |
|---|---|---|
| 5,866,952 A | 2/1999 | Wojnarowski et al. |
| 7,659,145 B2 | 2/2010 | Do et al. |
| 7,807,512 B2 | 10/2010 | Lee et al. |
| 7,838,975 B2 | 11/2010 | Chen |

(Continued)

FOREIGN PATENT DOCUMENTS

| | | |
|---|---|---|
| CN | 1158006 A | 8/1997 |
| CN | 2591772 Y | 12/2003 |

(Continued)

*Primary Examiner* — Sheikh Maruf
(74) *Attorney, Agent, or Firm* — Slater Matsil, LLP (57) ABSTRACT

The present embodiments provides a chip, including a carrier, a redistribution structure, and multiple packaging function modules, where the multiple packaging function modules each have at least a part wrapped by a colloid, and are fastened to the redistribution structure side by side; the redistribution structure is fastened to the carrier, and the redistribution structure includes one or more redistribution metal layers; the redistribution metal layer communicatively connects the multiple packaging function modules and the carrier. The redistribution structure further includes one or more interconnect metal layers, and the interconnect metal layer is communicatively connected to at least two packaging function modules so as to provide a signal path between the at least two packaging function modules. In the chip, two packaging function modules are placed on the carrier side by side, and a signal path is established between the two packaging function modules by using the redistribution structure.

13 Claims, 5 Drawing Sheets

(56) References Cited

U.S. PATENT DOCUMENTS

| | | | |
|---|---|---|---|
| 7,858,441 B2 | 12/2010 | Lin et al. | |
| 8,093,722 B2 | 1/2012 | Chen et al. | |
| 8,310,051 B2 | 11/2012 | Chen et al. | |
| 8,372,689 B2 | 2/2013 | Lee et al. | |
| 8,389,333 B2 | 3/2013 | Camacho | |
| 8,624,374 B2 | 1/2014 | Ding et al. | |
| 8,624,376 B1 | 1/2014 | Chen et al. | |
| 8,927,412 B1 | 1/2015 | Lin et al. | |
| 2004/0140559 A1* | 7/2004 | Goller | H01L 23/49833 257/734 |
| 2004/0219713 A1* | 11/2004 | Lee | H01L 23/13 438/106 |
| 2007/0257363 A1* | 11/2007 | Yuzawa | H01L 23/522 257/737 |
| 2007/0262436 A1* | 11/2007 | Kweon | H01L 21/561 257/686 |
| 2008/0128884 A1* | 6/2008 | Meyer | H01L 21/568 257/686 |
| 2008/0316714 A1* | 12/2008 | Eichelberger | H01L 21/6835 361/728 |
| 2009/0035895 A1 | 2/2009 | Lee et al. | |
| 2009/0206461 A1* | 8/2009 | Yoon | H01L 21/565 257/686 |
| 2009/0212410 A1* | 8/2009 | Wu | H01L 25/0657 257/686 |
| 2009/0250822 A1* | 10/2009 | Chen | H01L 23/5385 257/777 |
| 2009/0294938 A1* | 12/2009 | Chen | H01L 21/563 257/676 |
| 2009/0309209 A1 | 12/2009 | Chen | |
| 2010/0032821 A1* | 2/2010 | Pagaila | H01L 25/0657 257/686 |
| 2010/0123236 A1* | 5/2010 | Kang | H01L 24/91 257/686 |
| 2010/0258937 A1* | 10/2010 | Shim, II | H01L 21/568 257/692 |
| 2011/0018129 A1* | 1/2011 | Suzuki | G02F 1/13452 257/737 |
| 2011/0031619 A1* | 2/2011 | Chen | H01L 21/563 257/738 |
| 2011/0089561 A1 | 4/2011 | Kurita et al. | |
| 2011/0101520 A1* | 5/2011 | Liu | H01L 23/5329 257/737 |
| 2011/0133325 A1* | 6/2011 | Moon | H01L 23/3128 257/686 |
| 2012/0049364 A1* | 3/2012 | Sutardja | H01L 24/24 257/738 |
| 2012/0161332 A1 | 6/2012 | Chua et al. | |
| 2012/0299191 A1 | 11/2012 | Camacho | |
| 2013/0105991 A1 | 5/2013 | Gan et al. | |
| 2013/0182402 A1 | 7/2013 | Chen et al. | |
| 2013/0187270 A1 | 7/2013 | Yu et al. | |
| 2013/0234322 A1 | 9/2013 | Pendse | |
| 2013/0249101 A1 | 9/2013 | Lin et al. | |
| 2013/0256836 A1 | 10/2013 | Hsiao et al. | |
| 2013/0256883 A1 | 10/2013 | Meyer et al. | |
| 2014/0001645 A1 | 1/2014 | Lin et al. | |
| 2014/0015131 A1 | 1/2014 | Meyer et al. | |
| 2014/0070422 A1* | 3/2014 | Hsiao | H01L 24/24 257/774 |
| 2014/0084391 A1* | 3/2014 | Lenive | H01L 24/24 257/414 |
| 2014/0217615 A1* | 8/2014 | Kuisma | H01L 25/16 257/777 |
| 2014/0264910 A1* | 9/2014 | Razdan | H01L 25/0657 257/774 |
| 2015/0035164 A1 | 2/2015 | Ma et al. | |
| 2015/0041190 A1* | 2/2015 | Bonifield | H05K 1/162 174/257 |
| 2015/0206854 A1* | 7/2015 | Lane | H01L 25/0657 257/738 |
| 2015/0228632 A1* | 8/2015 | Yu | H01L 23/5384 257/704 |
| 2015/0348905 A1* | 12/2015 | Tsai | H01L 21/76898 257/774 |
| 2015/0357307 A1 | 12/2015 | Fu et al. | |
| 2016/0155730 A1* | 6/2016 | Yu | H01L 21/565 257/774 |
| 2016/0218063 A1* | 7/2016 | Tsai | H01L 24/20 |
| 2016/0218090 A1* | 7/2016 | Yu | H01L 23/5226 |
| 2017/0200702 A1* | 7/2017 | Hung | H01L 25/0657 |

FOREIGN PATENT DOCUMENTS

| | | |
|---|---|---|
| CN | 101256997 A | 9/2008 |
| CN | 100580918 C | 1/2010 |
| CN | 101315919 B | 8/2010 |
| CN | 101593734 B | 3/2011 |
| CN | 102263074 A | 11/2011 |
| CN | 104064551 A | 9/2014 |
| JP | 4413174 B2 | 2/2010 |
| JP | 2011086829 A | 4/2011 |
| JP | 2013038306 A | 2/2013 |

* cited by examiner

FIG. 1

<Prior Art>

CHIP

CROSS-REFERENCE TO RELATED APPLICATIONS

This application is a continuation of International Application No. PCT/CN2015/076562, filed on Apr. 14, 2015, the disclosure of which is hereby incorporated by reference in its entirety.

TECHNICAL FIELD

Embodiments of the present invention relate to chip technologies, and in particular, to a chip in which multiple packaging function modules are packaged side by side.

BACKGROUND

With the advance of a semiconductor process and the improvement of a chip function, increasing integrated circuits can be accommodated in a chip. Based on an industrial manufacturing requirement, an integrated circuit applied to a chip is carried in various dies. With the development of the process and for a purpose of a higher functional requirement, a packaging manner in which two or more than two dies are packaged together catches increasing attention in the industry.

Figure 1:
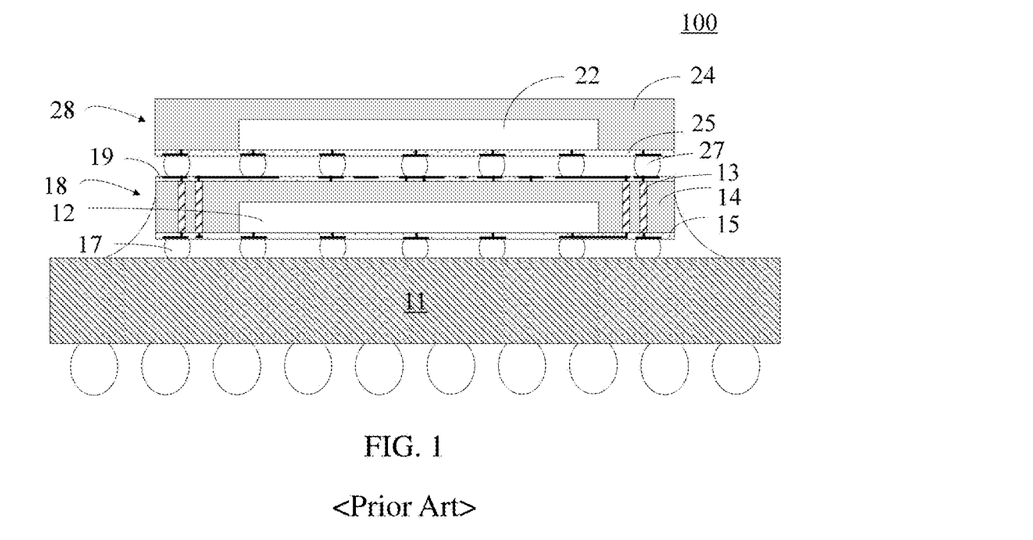
FIG. 1 is a cross-sectional view of a chip in the prior art.

Multiple dies packaged in one chip do not independently work. There is a requirement of data interaction between different dies, and a length of a data path has relatively great impact on performance of a chip. Therefore, how to shorten a length of a path of data communication between dies becomes an important topic in the industry. Currently, there is a three dimensional (3D) integrated packaging technology in the industry. As shown in FIG. 1, a carrier n of a chip 100 carriers a wafer-level packaging (hereinafter referred to as WLP) 18. The WLP 18 includes a die 12, a colloid 14 wrapped around the die 12, and a redistribution layer 15 formed on surfaces of the die 12 and the colloid 14. Bumps 17 are disposed at a bottom of the redistribution layer 15. The redistribution layer 15 and the bumps 17 form a signal path between the die 12 and the carrier 11.

The chip 100 further includes a WLP 28 carried on a top of the WLP 18. Similar to the WLP 18, the WLP 28 includes a die 22, a colloid 24, a redistribution layer 25, and bumps 27. A redistribution layer 19 is disposed on the top of the WLP 18, a vertical interconnect path 13 is disposed in the colloid 14 of the WLP 18. The redistribution layer 25 and the bumps 27 that are of the WLP 28. A signal path is established between the WLP 28 and the WLP 18 by using a metal layer in the redistribution layer 25, the bumps 27, a metal layer in the redistribution layer 19 of the WLP 18, a through silicon via 13, and the redistribution layer 15 of the WLP 18.

In the 3D packaging technology, a length of a signal path between two dies can be effectively shortened by means of superposition of two WLPs, but this also causes a new problem. First, superposition of the two WLPs causes a relatively severe dissipation problem; second, a process of a through silicon via is relatively difficult, which causes relatively high process costs.

SUMMARY

In view of this, embodiments of the present invention provide a chip that can implement short-distance interconnection between dies but does not cause a dissipation problem.

A first aspect of the embodiments of the present invention provides a chip, including a carrier, a redistribution structure, and multiple packaging function modules, where the multiple packaging function modules each have at least a part wrapped by a colloid, and are fastened to the redistribution structure side by side. The redistribution structure is fastened to the carrier, and the redistribution structure includes one or more redistribution metal layers. The redistribution metal layer communicatively connects the multiple packaging function modules and the carrier. Also, the redistribution structure further includes one or more interconnect metal layers, and the interconnect metal layer is communicatively connected to at least two packaging function modules so as to provide a signal path between the at least two packaging function modules.

In a first possible implementation manner, a main body of the redistribution structure is made of an insulation material, and the interconnect metal layer and the redistribution metal layer are mutually independent in the main body.

With reference to the first aspect and the first possible implementation manner of the first aspect, in a second possible implementation manner, pins are disposed on the multiple packaging function modules, and the pins are arranged between the packaging function modules and the redistribution structure, and are electrically connected to the redistribution metal layer or the interconnect metal layer.

With reference to the first aspect, the first possible implementation manner of the first aspect, or the second possible implementation manner of the first aspect, in a third possible implementation manner, a bump array is disposed on the main body of the redistribution structure, and the bump array is electrically connected to the carrier and the redistribution metal layer.

With reference to the first aspect and the third possible implementation manner of the first aspect, in a fourth possible implementation manner, underfill is filled between the redistribution structure and the carrier, into a gap of the bump array, and around the bump array.

With reference to the first aspect and any implementation manner of the first possible implementation manner of the first aspect to the fourth possible implementation manner of the first aspect, in a fifth possible implementation manner, a pad or a connector is disposed at a bottom of the carrier.

With reference to the first aspect and any implementation manner of the first possible implementation manner of the first aspect to the fifth possible implementation manner of the first aspect, in a sixth possible implementation manner, sides that are of the multiple packaging function modules and deviate from the carrier are not wrapped by the colloid.

With reference to the first aspect and the sixth possible implementation manner of the first aspect, in a seventh possible implementation manner, surfaces of the sides that are of the multiple packaging function modules and deviate from the carrier are coated with thermal adhesives; and the chip further includes a heat sink, where the heat sink is attached to the surfaces of the sides that are of the multiple packaging function modules and deviate from the carrier.

With reference to the first aspect and the seventh possible implementation manner of the first aspect, in an eighth possible implementation manner, the heat sink includes a first part that is attached to tops of the multiple packaging function modules and a second part that surrounds the multiple packaging function modules and is fastened to a surface of the carrier by an adhesive.

With reference to the first aspect and any one of the first possible implementation manner of the first aspect to the fifth possible implementation manner of the first aspect, in a ninth possible implementation manner, the chip further includes a ring heat sink, and the ring heat sink is disposed around the packaging function module, and is fastened to the carrier by an adhesive.

With reference to the first aspect and any one of the first possible implementation manner of the first aspect to the ninth possible implementation manner of the first aspect, in a tenth possible implementation manner, the interconnect metal layer includes a first interconnect metal layer and a second interconnect metal layer, where a part of the first interconnect metal layer and a part of the second interconnect metal layer are mutually parallel; a reference metal layer is disposed between the parallel parts of the first interconnect metal layer and the second interconnect metal layer; and the reference metal layer is insulated from another metal layer in the redistribution structure.

With reference to the first aspect and any one of the first possible implementation manner of the first aspect to the tenth possible implementation manner of the first aspect, in an eleventh possible implementation manner, the packaging function module may be any one of the following: a die, stack dies, and a packaged chip.

In the chip provided in the embodiments of the present invention, two packaging function modules are placed on a carrier side by side, and a signal path between the two packaging function modules is established by using a redistribution structure. Therefore, there is no dissipation problem caused by superposition; in addition, it can be effectively ensured that a length of the signal path between the packaging function modules is not excessively long.

BRIEF DESCRIPTION OF THE DRAWINGS

To describe the technical solutions in the embodiments of the present invention more clearly, the following briefly describes the accompanying drawings required for describing the embodiments. Apparently, the accompanying drawings in the following description show some embodiments of the present invention, and a person of ordinary skill in the art may still derive other drawings from these accompanying drawings without creative efforts.

DETAILED DESCRIPTION OF ILLUSTRATIVE EMBODIMENTS

To make the objectives, technical solutions, and advantages of the embodiments of the present invention clearer, the following clearly describes the technical solutions in the embodiments of the present invention with reference to the accompanying drawings in the embodiments of the present invention. Apparently, the described embodiments are some but not all of the embodiments of the present invention. All other embodiments obtained by a person of ordinary skill in the art based on the embodiments of the present invention without creative efforts shall fall within the protection scope of the present embodiments.

The present embodiments provide a chip of a new form. In the present invention, multiple dies are packaged on a surface of a carrier of the chip side by side, and a data path between the dies is directly established in a redistribution structure. In such a manner, on the one hand, a length of the data path between the dies can be effectively shortened; on the other hand, because there is no mutual impact between stacked chips, a better dissipation effect can be obtained.

Figure 2:
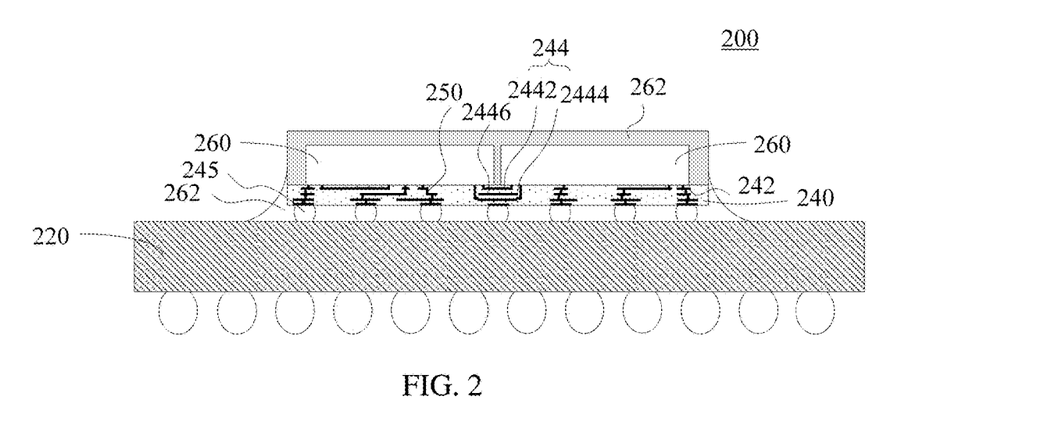
FIG. 2 is a cross-sectional view of a chip according to an embodiment of the present invention.
Figure 3A:
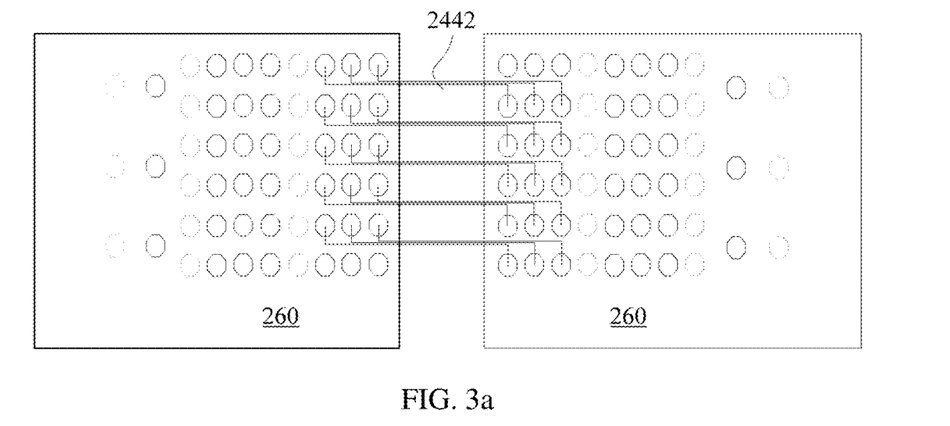
FIG. 3a and FIG. 3b are interconnection views of pins of dies in a chip by using an interconnect metal layer according to an embodiment of the present invention.
Figure 3B:
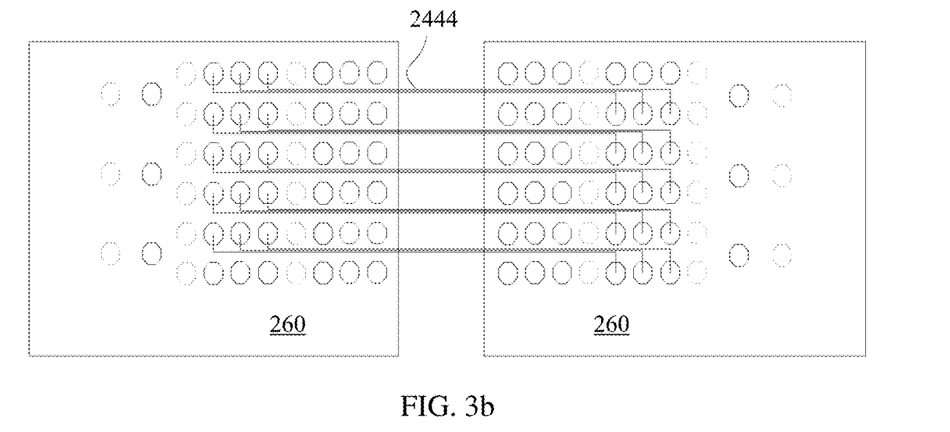

FIG. 2 is a schematic diagram of a chip 200 according to a first embodiment of the present invention. The chip 200 includes a carrier 220, a redistribution structure 240, and multiple dies 260. In this embodiment of the present invention, the multiple dies mean two or more than two dies; for example, the chip shown in FIG. 1 includes two dies. The multiple dies 260 are fastened to a top of the redistribution structure 240 side by side, and the redistribution structure 240 is fastened to a top of the carrier 220.

In this embodiment of the present invention, multiple dies packaged in one chip may be homogeneous chips, or may be heterogeneous chips. For example, an analog die and a digital die may be packaged together, or dies produced by using different wafer process nodes may be packaged together, or dies with different functions may be packaged together. In this embodiment of the present invention, at least two dies 260 are wrapped by a colloid 262, and are fastened to the top of the redistribution structure 240 side by side. The redistribution structure 240 shown in FIG. 2 is a rectangle structure, and the top of the redistribution structure 240 is flat. In actual application, however, the redistribution structure 240 may have an irregular shape, so that a height difference may exist on the top that is used to fasten the dies 260. However, in this embodiment of the present invention, that at least two dies 260 are fastened to the top of the redistribution structure 240 side by side does not mean that the dies 260 need to be disposed in a parallel manner, but merely means that at least two dies in the chip do not have a superposition relationship with each other, but are "equally" fastened to a surface of the redistribution structure 240.

A main body of the redistribution structure 240 is made of an insulation material, and one or more redistribution metal layers 242 are inserted into the redistribution structure 240 or on the surface of the redistribution structure 240. The redistribution metal layers 242 are arranged layer by layer as one or more tree structures, and adjacent layers are electrically connected by using a copper plated via 250. A redistribution metal layer located on the top of the redistribution structure 240 is attached to a signal pin of the die 260. A bump array 245 is disposed at a bottom of the redistribution structure 240, so as to fasten the redistribution structure 240 to the carrier 220 in a tin soldering manner, and form a signal path between the die 260 and the carrier 220. In the redistribution structure 240, the multiple redistribution metal layers 242 form multiple tree structures, and each tree structure is formed by multiple redistribution metal layers 242 and copper plated vias between the redistribution metal layers. These tree structures are not connected to each other inside the redistribution structure 240, and they each are connected to a signal pin of a corresponding die and a bump at the bottom of the redistribution structure 240, so as to form different signal paths inside the redistribution structure.

Further, underfill 262 may be filled between the redistribution structure 240 and the carrier, which helps alleviate stress on a solder ball, and improve packaging reliability.

In this embodiment of the present invention, the redistribution structure 240 further includes one or more interconnect metal layers 244. The interconnect metal layer 244 and the redistribution metal layer 242 are mutually independent in the redistribution structure 240, that is, the interconnect metal layer and the redistribution metal layer are not connected to each other in the redistribution structure 240. The interconnect metal layer is not connected to a bump at the bottom of the redistribution structure 240 either. Any one of the interconnect metal layers 244 is electrically connected in a direct or indirect manner to pins of two different dies 260, so as to establish a signal path between the two dies.

According to the chip provided in the present embodiments, the dies 260 are disposed on the redistribution structure 240 side by side, which avoids a dissipation problem caused by superposition of the dies. In addition, according to design of the interconnect metal layer 244, data communication is performed between the dies directly by using the redistribution structure 240. This process is simple, and the design complexity is low, thereby effectively reducing process costs.

Figure 4:
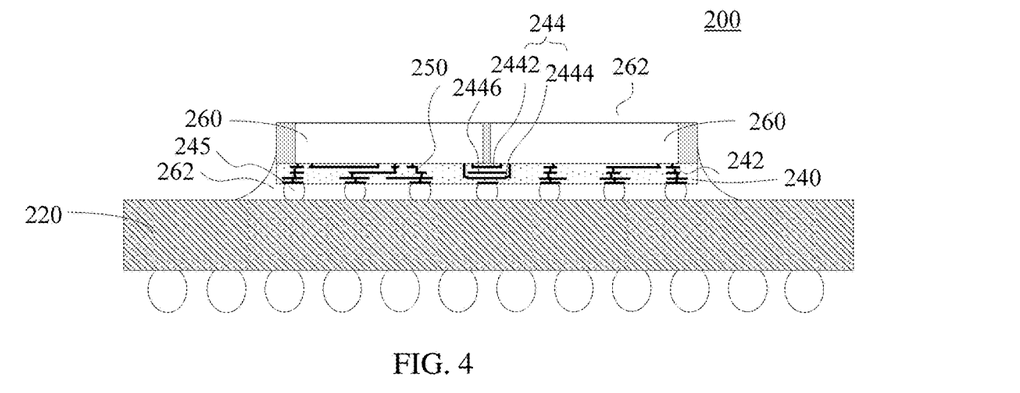
FIG. 4 is a cross-sectional view of a chip according to another embodiment of the present invention.

Further, in an optional embodiment, as shown in FIG. 2 and FIG. 4, the interconnect metal layer 244 includes a first interconnect metal layer 2442 and a second interconnect metal layer 2444 that are used to connect different pins of two dies. A part of the first interconnect metal layer 2442 and a part of the second interconnect metal layer 2444 approach to each other and are mutually parallel in the redistribution structure 240. In this way, signal crosstalk may occur between the first interconnect metal layer 2442 and the second interconnect metal layer 2442, which affects signal transmission quality. To resolve this problem, a reference metal layer 2446 parallel to the two interconnect metal layers may be disposed inside the redistribution structure 240 and between the first interconnect metal layer 2442 and the second interconnect metal layer 2444, where the reference metal layer 2446 is surrounded by a medium layer of the redistribution structure, and the reference metal layer is insulated from another metal layer in the redistribution structure.

The die and a reconstitution wiring layer in the chip provided in this embodiment of the present invention may be manufactured by using the following process.

Step 1. Cut at least two dies from an original wafer in a wafer cutting manner.

Step 2. Reconstitute (Reconstitution) the cut dies on a carrier of a predetermined size.

It should be noted that, a spacing between the dies affects performance of high density interconnection between the dies. The spacing between the dies is shortened as much as possible, for example, to below 50 um, in a case in which the shortening is allowed.

Step 3. Form a colloid in a molding manner to wrap the dies.

After the die is wrapped by the colloid, a side that is of the die and corresponds to the redistribution structure needs to be made exposed by using a particular process processing method; for example, by using a grinding method, or, a corresponding position of the die is covered by a temporary carrier in a molding process, and the carrier is directly removed after the wrapping is completed.

Step 4. Make, by using a redistribution process, a redistribution structure on a side that is of the die and corresponds to the redistribution structure.

A medium of the main body of the redistribution structure may be formed by an organic medium that is insulated and is photo imageable upon exposure, such as a polyimide (hereinafter referred to as PI), poly-p-phenylenebenzobisthiazole (hereinafter referred to as PBO), or an epoxy based. However, the redistribution metal layer and the interconnect metal layer may be made on the basis of the medium of the main body by using a process such as spluttering and plating, where a used material may be copper. A minimum line width and a line distance of the metal layer may respectively be: the line width is from 2 um to 1 um or shorter; the line distance is from 2 um to 1 um or shorter. A copper plated via may be made on the medium of the main body, so as to implement interconnection between different redistribution metal layers, where diameters of a via and a via land of the copper plated via may respectively reach 5 um and 10 um or shorter.

After the die, the colloid, and the redistribution structure are generated, the redistribution structure may be attached to a base board in a manner of hot air reflow (Mass Reflow), thermo compression bonding, or the like. Bottom underfill may be applied between the redistribution structure and the base board as required, to alleviate stress on a bump of the redistribution structure, so as to improve packaging reliability. The base board may be a multilayer base board, and inter-layer signal intercommunication is implemented in a manner of, for example, laser drilling Laser Drill or mechanical drilling Mechanical Drill and then copper plating. A pad is disposed at the bottom of the base board, so as to joint a printed circuit board (PCB) by using a solder ball. In another implementation manner, the bottom of the base board may be jointed to the PCB by using a pluggable connector (Socket).

Use of a multilayer base board can significantly increase a wiring resource used for packaging; in addition, a larger quantity of pins can be implemented by using a base board with a relatively large size specification, which can improve power integrity of packaging, and meanwhile can further greatly improve board-level reliability of packaging. On the basis of this, multiple redistribution metal layers in a redistribution structure are utilized in the present embodiments, so that a requirement for reducing a quantity of layers of a base board can be met, thereby reducing packaging costs.

In actual application, the die except for a side close to the redistribution structure may be wrapped by the colloid. However, to further improve dissipation efficiency, exposure processing such as grinding may be performed on a side that is of the die and away from the redistribution structure, so as to expose the side that is of the die and away from the redistribution structure, thereby improving dissipation efficiency, specifically as shown in FIG. 4. Alternatively, a carrier may certainly be used to prevent this side of the die from being covered by the colloid when the die is being wrapped.

Figure 5:
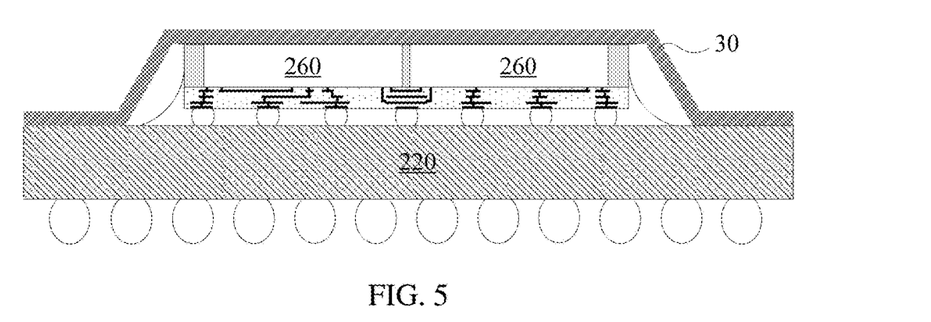
FIG. 5 is a cross-sectional view of a chip according to a third embodiment of the present invention.
Figure 6A:
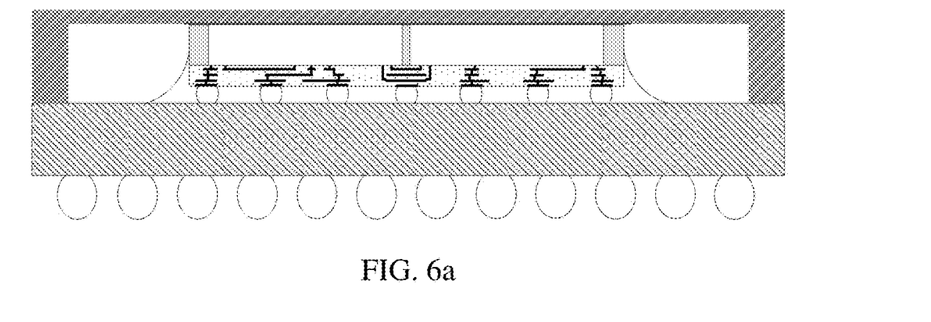
FIG. 6a to FIG. 6d are cross-sectional views of a chip equipped with various types of heat sinks according to an embodiment of the present invention.
Figure 6B:
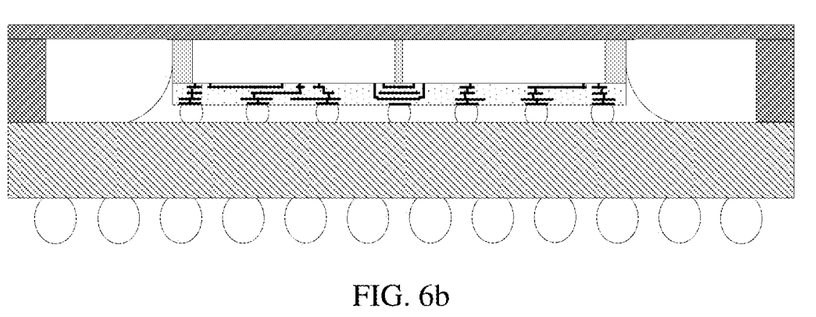
Figure 6C:
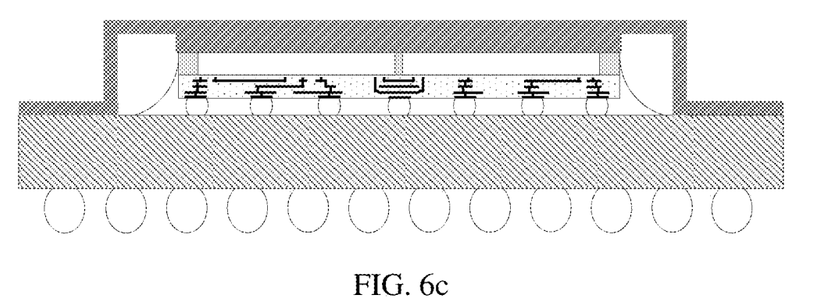

To further improve dissipation efficiency, as shown in FIG. 5, a surface of the side that is of the die and away from the redistribution structure may be coated with a thermal adhesive, and then a heat sink 30 is attached. The heat sink shown in FIG. 5 is in a cap structure, the heat sink is globally bent and end segments are attached to a carrier 220. According to the heat sink of such a shape, on the one hand, heat dissipation of the die can be promoted; on the other hand, all dies are wrapped together, which is used as a further position limit, thereby effectively improving stability of a packaging structure. Certainly, a shape of the heat sink may be in other various forms. For example, a heat sink shown in FIG. 6a is a forged unibody heat sink; a heat sink shown in FIG. 6b is a two-piece heat sink combined by at least two parts of dissipation metal sheets by using a post-processing mean. In FIG. 6c, a part attached to the die is blocked up based on the heat sink in FIG. 6a or FIG. 6b by using a boss.

Figure 6D:
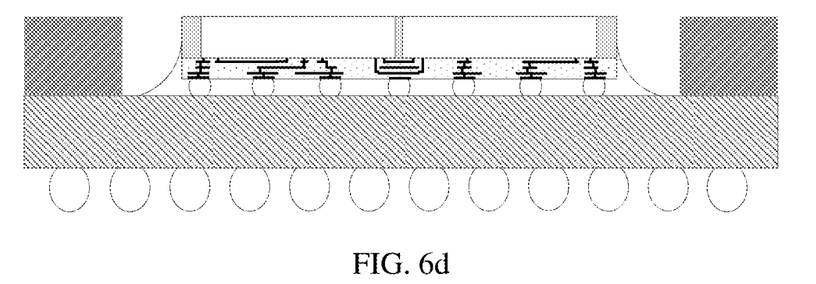

Alternatively, as shown in FIG. 6d, a ring heat sink (Ring Lid) may further be used. In this case, a layer that is of the die and away from the redistribution structure still does not need to be wrapped by the colloid, and the ring heat sink is arranged around the die and is fastened to the carrier by an adhesive. When being used on a mainboard, an external heat dissipator may be attached to the exposed side of the die and a top side of the ring heat sink, so as to obtain a better dissipation effect.

Figure 7:
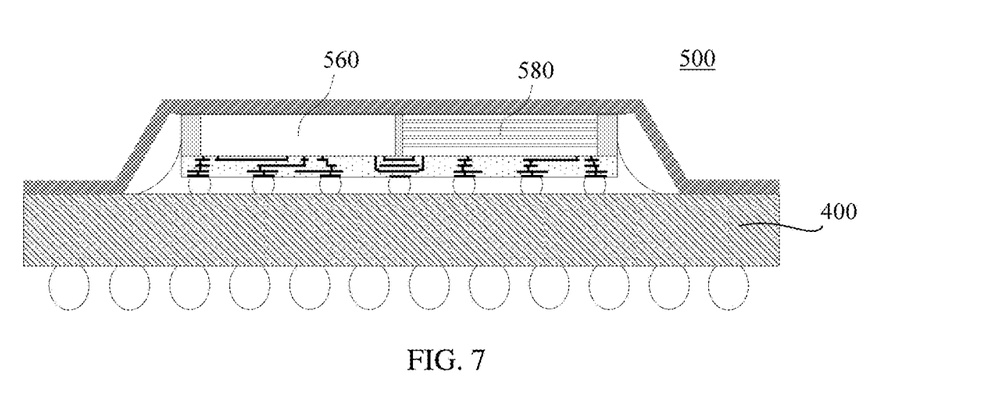
FIG. 7 is a cross-sectional view of a chip equipped with a ring heat sink according to an embodiment of the present invention.

In the foregoing embodiments, packaging of two or more than two dies is always used as an example for description. Actually, however, the chip in the present embodiments is not limited only to packaging of the dies, the chip technology may be used in various to-be-packaged packaging function modules, where the to-be-packaged packaging function module may be the die in the foregoing embodiments, or may be a functionality module group that includes stack dies, or even may be a "chip" that has been packaged once. FIG. 7 is a schematic diagram of a chip of another type based on the packaging structure in the embodiments of the present invention. A chip 500 includes a die 560 and stack dies 580 that are carried on a redistribution structure 400. It should be understood that, in an optional implementation manner, a function module packaged in the chip in this embodiment of the present invention may be any combination of various types of function modules, such as a die and stack dies, a die and a chip that has been packaged once, or stack dies and a chip that has been packaged once. In addition, a quantity of function modules packaged in the chip may also be adjusted as required, and is not limited only to that merely two function modules (dies) are packaged side by side in the foregoing embodiments.

The foregoing embodiments are merely intended for describing the technical solutions of the present application, but not for limiting the present application. Although the present application is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of the present application.

What is claimed is:

1. A chip comprising:
a redistribution layer-comprising a redistribution layer including a main body formed by an insulation material;
at least one layer formed in the main body comprising metals;
vias formed in the main body for coupling the metals to a top or a bottom of the main body, wherein the metals comprises at least one redistribution metal and at least one interconnect metal formed on the at least one layer; and
two or more dies fastened side-by-side to the top of the main body,
wherein the at least one redistribution metal and some of the vias form a first signal path in the main body to communicatively couple at least one of the two or more dies to connectivity elements at the bottom of the main body, and
wherein the at least one interconnect metal and some of the vias form a second signal path in the main body to communicatively couple at least two of the two or more dies together.

2. The chip according to claim 1, wherein the connectivity elements of the redistribution layer comprises pads or bumps.

3. The chip according to claim 1, wherein the at least one interconnect metal and the at least one redistribution metal are mutually independent in the main body.

4. The chip according to claim 1, wherein the connectivity elements comprise a bump array disposed on the main body of the redistribution layer.

5. The chip according to claim 1, further comprising a carrier, wherein the redistribution layer is disposed on the carrier.

6. The chip according to claim 5, wherein an underfill is filled between the redistribution layer and the carrier.

7. The chip according to claim 5, wherein a pad or a connector is disposed at a bottom of the carrier.

8. The chip according to claim 5, further comprising a ring heat sink, wherein the ring heat sink is disposed around the two or more dies, and wherein the ring heat sink is fastened to the carrier by an adhesive.

9. The chip according to claim 1, wherein tops of the two or more dies are coated with thermal adhesives, wherein the chip further comprises a heat sink, and wherein the heat sink is attached to the tops and sides of the two or more dies.

10. The chip according to claim 9, wherein the heat sink comprises a first part and a second part, and wherein the first part is attached to the tops of the two or more dies and the second part surrounds the two or more dies.

11. The chip according to claim 10, further comprising a carrier, wherein the redistribution layer is disposed on the carrier, and wherein the second part of the heat sink is fastened to the carrier.

12. The chip according to claim 1, wherein pins are disposed on the two or more dies, wherein the pins are arranged between the two or more dies and the redistribution layer, and wherein the pins are electrically connected to the at least one redistribution metal or to the at least one interconnect metal.

13. The chip according to claim 1, wherein the at least one interconnect metal comprises a first interconnect metal and a second interconnect metal, wherein a part of the first interconnect metal and a part of the second interconnect metal are mutually parallel, wherein a reference metal layer is disposed between parallel parts of the first interconnect metal and the second interconnect metal, and wherein the reference metal layer is insulated from another metal layer in the redistribution layer.

* * * * *